United States Patent
Jin et al.

(10) Patent No.: US 8,310,033 B2
(45) Date of Patent: Nov. 13, 2012

(54) SEMICONDUCTOR INTEGRATED CIRCUIT HAVING A MULTI-CHIP STRUCTURE

(75) Inventors: Sin-Hyun Jin, Gyeonggi-do (KR); Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 12/831,467

(22) Filed: Jul. 7, 2010

(65) Prior Publication Data
US 2011/0291265 A1    Dec. 1, 2011

(30) Foreign Application Priority Data
May 27, 2010   (KR) ........................ 10-2010-0049717

(51) Int. Cl.
*H01L 29/40*    (2006.01)
(52) U.S. Cl. ........ 257/621; 257/698; 257/774; 257/777; 257/E23.011; 257/E23.174; 257/E21.597; 438/667; 438/700; 438/109
(58) Field of Classification Search .................. 257/621, 257/698, 774, 777, E23.011, E23.174, E21.597; 438/667, 700, 109
See application file for complete search history.

(56) References Cited

U.S. PATENT DOCUMENTS
| | | | | |
|---|---|---|---|---|
| 5,933,753 | A * | 8/1999 | Simon et al. ................. | 438/629 |
| 6,548,892 | B1 * | 4/2003 | Steiner et al. ................. | 257/701 |
| 2011/0204505 | A1 * | 8/2011 | Pagaila et al. ................. | 257/686 |

* cited by examiner

*Primary Examiner* — Tu-Tu Ho
(74) *Attorney, Agent, or Firm* — IP & T Group LLP (57) ABSTRACT

A semiconductor integrated circuit having a multi-chip structure includes a number of stacked semiconductor chips. Each of the semiconductor chips includes a first through electrode formed through the semiconductor chip, a first bump pad formed over the semiconductor chip at a region where the first bump pad is separated from the first through electrode, a first internal circuit formed inside the semiconductor chip, coupled to the first through electrode through a first metal path, and coupled to the first bump pad through a second metal path; and a redistribution layer (RDL) formed over a backside of the semiconductor chip.

20 Claims, 7 Drawing Sheets

SEMICONDUCTOR INTEGRATED CIRCUIT HAVING A MULTI-CHIP STRUCTURE

CROSS-REFERENCE TO RELATED APPLICATIONS

The present application claims priority of Korean Patent Application No. 10-2010-0049717, filed on May 27, 2010, which is incorporated herein by reference in its entirety.

BACKGROUND OF THE INVENTION

Exemplary embodiments of the present invention relate to a semiconductor integrated circuit having a multi-chip structure, and more particularly, to a semiconductor integrated circuit in which an internal circuit of each semiconductor chip is coupled in series to a through silicon via (TSV).

In the semiconductor industry, packaging technology for integrated circuits has been continuously developed to satisfy demands for miniaturization and mounting reliability. For example, the demand for miniaturization has accelerated the technology development for a package having a size close to a chip size, and the demand for mounting reliability has underlined the importance for packaging technology capable of improving the efficiency of a mounting operation and the mechanical and electrical reliability after mounting.

Furthermore, as the high performance of electrical and electronic products has been demanded with the miniaturization of electrical and electronic products, a variety of technologies for providing a high-capacity semiconductor module have been researched and developed.

To provide a high-capacity semiconductor module, the high integration of memory chips is useful. The high integration may be realized by integrating a larger number of cells in a limited space of a semiconductor chip.

However, the high integration of memory chips requires a high-level technique and a large amount of development time. For example, a minute line width is useful. Therefore, stack technology has been proposed as another method for providing a high-capacity semiconductor module.

The stack technology may include building two stacked chips into one package and stacking two single packages. However, the stacking of two single packages has a limit to reducing the height of a semiconductor package with a miniaturization trend of electrical and electronic products.

Therefore, much research is being actively conducted on a stack package and a multi-chip package, in which two or more semiconductor chips are mounted in one package.

The multi-chip package may be typically fabricated by the following methods. First, several semiconductor chips may be simply arranged on a substrate and then packaged. Second, two or more semiconductor chips may be stacked in a multi-layered structure and then packaged.

As an example of the second method, a structure using a through silicon via (TSV) has been proposed. A package using the TSV is realized by the following process. First, a hole is formed in a semiconductor chip to pass through the semiconductor chip, and the hole is then filled with a conductive material to form a TSV. The upper and lower semiconductor chips are then coupled through the TSV.

Figure 1:
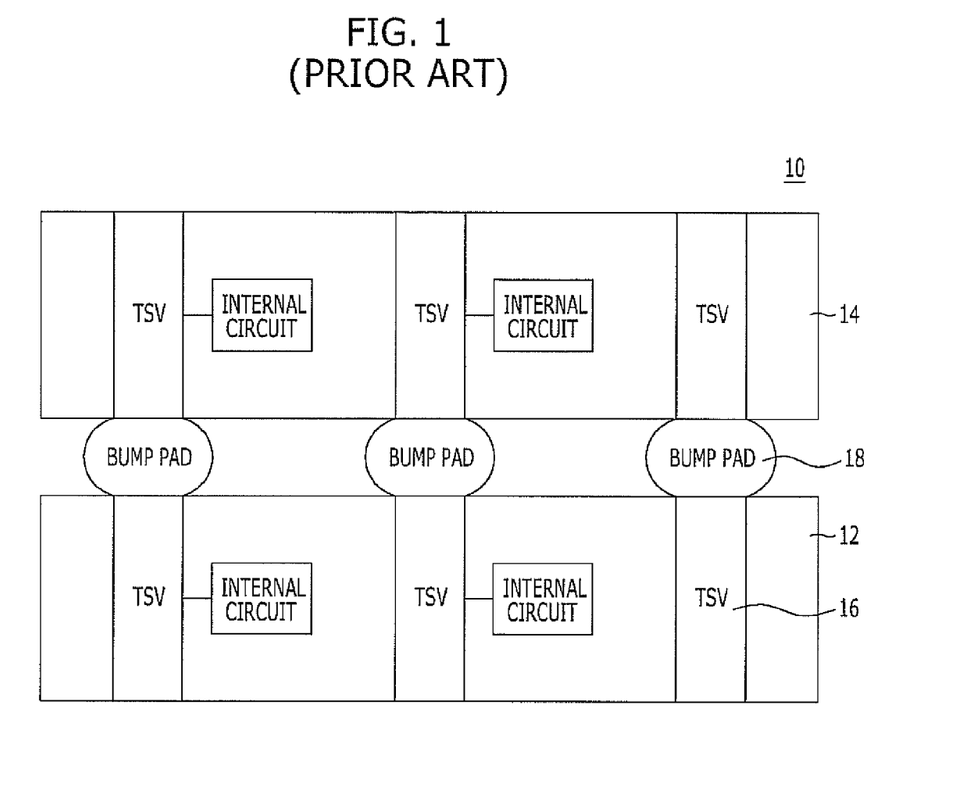
FIG. 1 is a cross-sectional view illustrating a conventional semiconductor integrated circuit having a multi-chip structure using TSVs.

FIG. 1 is a cross-sectional view illustrating a conventional semiconductor integrated circuit having a multi-chip structure using TSVs.

Referring to FIG. 1, a multi-chip package 10 using TSVs includes a plurality of semiconductor chips 12 and 14 stacked on a substrate. Each of the semiconductor chips 12 and 14 includes a plurality of through electrodes 16 formed by filling the TSVs therein. Therefore, the semiconductor chips 12 and 14 are stacked in such a manner that the through electrodes 16 disposed at the corresponding positions are coupled to each other.

A plurality of bump pads 18 are formed over the semiconductor 12 so as to maintain a predetermined distance between the respective semiconductor chips 12 and 14. Therefore, the first semiconductor chip 12 having the TSVs 16 formed therein is coupled to the second semiconductor chip 14 through the bump pads 18. That is, the first and second semiconductor chips 12 and 14 are coupled through flip-chip bonding.

In the multi-chip package using the TSVs, the electrical coupling is achieved through the TSVs. Therefore, electrical degradation may be substantially prevented to increase the operation speed of the semiconductor chips, and the miniaturization may be achieved.

In the conventional semiconductor integrated circuit having a multi-chip structure, however, the TSVs are formed through the uppermost chip to the lowermost chip and then filled to form the through electrodes, and internal circuits of the respective chips receive a voltage signal in parallel through the through electrodes. In this case, in order to control the voltage signal of the through electrode and apply the controlled voltage signal to another chip, another through electrode is required for only the controlled voltage signal.

Such an increase of the number of through electrodes may reduce the performance of the circuit in terms of area and fail rate. Furthermore, when different electrical signals are to be applied to the respective chips through the through electrodes, the chips need to have different structures. In this case, a separate patterning process may be useful. Accordingly, a mask for the pattering process may be separately formed. This results in a high processing cost.

Furthermore, while the patterning process is performed, the position of the mask may be changed depending on the stack positions of the semiconductor chips. Therefore, the mass production efficiency decreases, and the cost inevitably increases.

SUMMARY OF THE INVENTION

An embodiment of the present invention is directed to a semiconductor integrated circuit having a multi-chip structure, which may couple through electrodes and internal circuits of semiconductor chips in series by using bump pads for coupling redistribution layers (RDLs) formed over a backside of the respective semiconductor chips to the through electrodes, thereby increasing a degree of freedom in design.

In an embodiment of the present invention, although a vertical column of through electrodes may be used, different voltage signals may be applied between the semiconductor chips inside the vertical column of the same through electrode. Therefore, since a separate patterning process and a separate mask may not be needed, it is possible to substantially prevent a reduction in mass production efficiency and a cost increase of the entire stack package.

Another embodiment of the present invention is directed to a semiconductor integrated circuit having a multi-chip structure, which may support the serial coupling and the parallel coupling of internal circuits and through electrodes between semiconductor chips.

In accordance with an embodiment of the present invention, a semiconductor integrated circuit having a multi-chip structure may include a plurality of stacked semiconductor chips. Each of the semiconductor chips may include: a first through electrode formed through the semiconductor chip; a first bump pad formed over the semiconductor chip at a region where the first bump pad is separated from the first through electrode; a first internal circuit formed inside the semiconductor chip, coupled to the first through electrode through a first metal path, and coupled to the first bump pad through a second metal path; and a redistribution layer (RDL) formed over a backside of the semiconductor chip.

The first internal circuit and the first through electrode of one semiconductor chip may be coupled in series to the first internal circuit and the first through electrode of another semiconductor chip disposed thereunder.

Each of the semiconductor chips may further include: a second through electrode formed through the semiconductor chip; a second bump pad formed over the semiconductor chip to be in contact with the second through electrode; and a second internal circuit arranged in the semiconductor chip and coupled to the second through electrode through a third metal path.

The second internal circuit and the second through electrode of one semiconductor chip may be coupled in parallel to the second internal circuit and the second through electrode of another semiconductor chip positioned thereunder.

In accordance with another embodiment of the present invention, a method for fabricating a semiconductor integrated circuit having a multi-chip structure may include: forming a first trench in a semiconductor chip which includes first and second metal paths and a first internal circuit coupled between the first and second metal paths, the first trench being coupled to the first metal path; forming a first through electrode by filling the first trench of the semiconductor chip, and forming a redistribution layer (RDL) over a backside of the semiconductor chip, the RDL coupling the first through electrode to a corresponding bump pad; and forming a first bump pad over the semiconductor chip at a region where the first bump pad is separated from the first through electrode, the first bump pad being coupled to the first internal circuit through the second metal path.

In accordance with another further embodiment of the present invention, a semiconductor integrated circuit having a multi-chip structure may include a plurality of stacked semiconductor chips. Each of the semiconductor chips may include: a serial through electrode formed through the semiconductor chip; a parallel through electrode formed through the semiconductor chip; a serial bump pad formed over the semiconductor chip at a region where the serial bump pad is separated from the serial through electrode; a parallel bump pad formed over the semiconductor chip to be in contact with the parallel through electrode; a first internal circuit arranged in the semiconductor chip and coupled to the serial through electrode and the serial bump pad through the first and second metal paths, respectively; a second internal circuit coupled to the parallel through electrode through a third metal path; and a redistribution layer (RDL) formed over a backside of the semiconductor chip including the serial through electrode.

DESCRIPTION OF SPECIFIC EMBODIMENTS

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
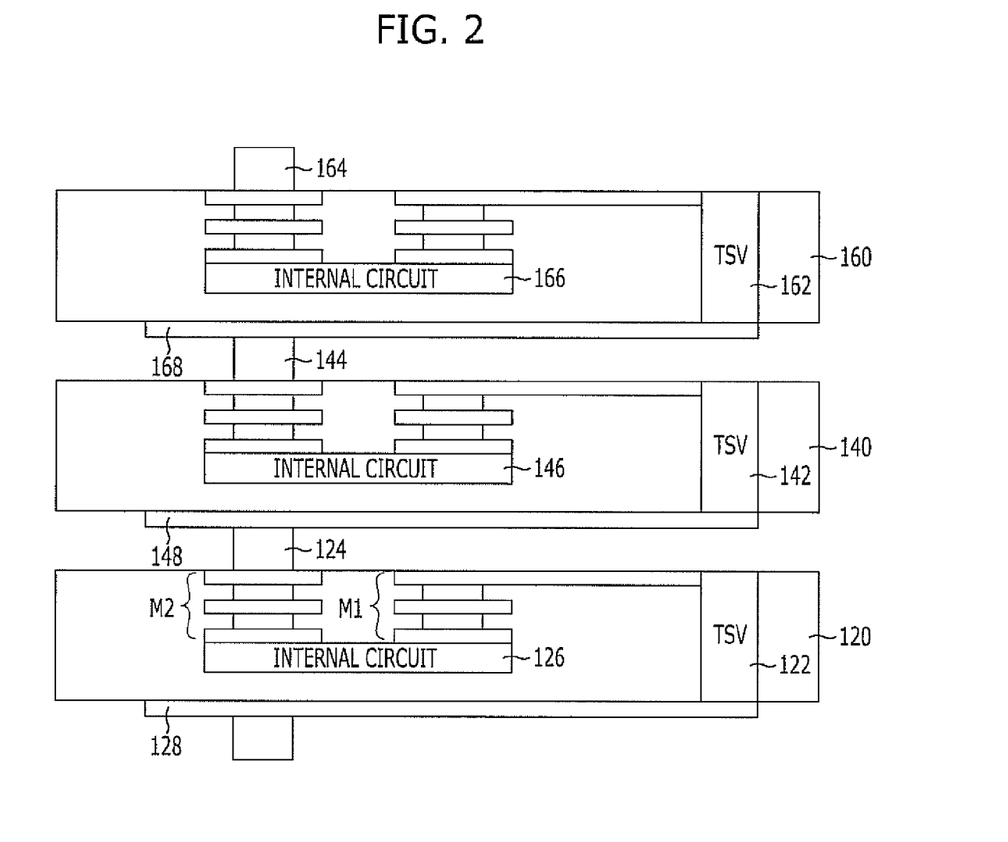
FIG. 2 is a cross-sectional view of a semiconductor integrated circuit having a multi-chip structure using TSVs in accordance with a first embodiment of the present invention.

FIG. 2 is a cross-sectional view of a semiconductor integrated circuit having a multi-chip structure using Through Silicon Vias (TSVs) in accordance with a first embodiment of the present invention.

Referring to FIG. 2, the semiconductor integrated circuit 100 having a multi-chip structure in accordance with the first embodiment of the present invention includes a plurality of stacked semiconductor chips 120, 140, and 160.

The first semiconductor chip 120 includes a serial through electrode 122, a first internal circuit 126, a serial bump pad 124, and a redistribution layer (RDL) 128. The serial through electrode 122 and the first internal circuit 126 are formed in the first semiconductor chip 120, the serial bump pad 124 is formed over a top surface of the first semiconductor chip 120, and the RDL 128 is formed over a backside of the first semiconductor chip 120.

Similarly, the second semiconductor chip 120 includes a serial through electrode 142, a first internal circuit 146, a serial bump pad 144, and an RDL 148. The serial through electrode 142 and the first internal circuit 146 are formed in the second semiconductor chip 140, the serial bump pad 144 is formed over a top surface of the second semiconductor chip 140, an the RDL 148 is formed over a backside of the second semiconductor chip 140.

Similarly, the third semiconductor chip 160 includes a serial through electrode 162, a first internal circuit 166, a serial bump pad 164, and an RDL 168. The serial through electrode 162 and the first internal circuit 166 are formed in the third semiconductor chip 160, the serial bump pad 164 is formed over a top surface of the third semiconductor chip 160, and the RDL 168 is formed over a backside of the third semiconductor chip 160.

Hereafter, the configuration of the respective semiconductor chips will be described. For the convenience of explanation, however, the following descriptions will be focused on the first semiconductor chip 120.

The serial through electrode 122 of the first semiconductor chip 120 is formed by burying a conductive material in a Through Silicon Via (TSV) formed through the first semiconductor chip 120.

The serial bump pad 124 of the first semiconductor chip 120 is formed over the top surface of the first semiconductor chip so as to maintain a predetermined distance between the semiconductor chips. In particular, the serial bump pad 124 in accordance with the first embodiment of the present invention is formed over the top surface of the first semiconductor chip 120 at a region where the serial bump pad 124 is separated from the serial through electrode 122.

The first internal circuit 126 of the first semiconductor chip 120 is provided in the first semiconductor chip 120 and configured to receive an input signal, perform a designated operation, and output a signal. In particular, the first internal circuit 126 in accordance with the first embodiment of the present invention is coupled to the serial through electrode 122 through a first metal path M1, and coupled to the serial bump pad 124 through a second metal path M2. Each of the first and second metal paths M1 and M2 includes a plurality of metal lines and a plurality of metal contacts provided between the respective metal lines.

The RDL 128 is formed over the backside of the first semiconductor chip 120 including the serial through electrode 122, in order to form a redistribution path.

In general, when the upper and lower semiconductor chips are coupled together, a multi-chip package cannot realize a normal memory operation as a structure in which the density is increased. Therefore, when the upper and lower semiconductor chips are stacked, an RDL is formed over the respective semiconductor chips such that the semiconductor chips may be discriminated depending on different signals thereof. Then, the RDL is coupled to the through electrode formed in the corresponding semiconductor chip and an electrode terminal, in order to discriminate the semiconductor chips.

In the first embodiment of the present invention, the RDL is formed over the backside of each semiconductor chip. Therefore, the RDLs formed over the backsides of the semiconductor chips and the serial bump pads formed over the top surfaces of the semiconductor chips to maintain a predetermined distance between the semiconductor chips may be used to couple the through electrodes and the internal circuits of the respective semiconductor chip in series. Then, although one vertical TSV column is used, a voltage signal which is controlled stage by stage while being passed through the respective semiconductor chips may be generated.

The serial through electrode and the RDL may be integrally formed. Although not illustrated, the semiconductor integrated circuit may further include a substrate to which the stacked semiconductor chips are attached. FIG. 2 illustrates a semiconductor integrated circuit including three semiconductor chips. However, the semiconductor integrated circuit may include a larger or smaller number of semiconductor chips.

In the first embodiment of the present invention, the internal circuit 126 and the serial through electrode 122 inside the first semiconductor chip 120 are coupled to the internal circuit 146 and the serial through electrode 142 inside the second semiconductor chip 140 through the RDL 148 formed over the backside of the second semiconductor chip 140 and the serial bump pad 124 formed over the top surface of the first semiconductor chip 120. Similarly, the internal circuit 146 and the serial through electrode 142 inside the second semiconductor chip 140 are coupled to the internal circuit 166 and the serial through electrode 162 inside the third semiconductor chip 160 through the RDL 168 formed over the backside of the third semiconductor chip 160 and the bump pad 144 formed over the top surface of the second semiconductor chip 140.

As a result, the semiconductor integrated circuit has the multi-chip structure in which the TSV and the internal circuit of one semiconductor chip are coupled in series to the TSV and the internal circuit of another semiconductor chip positioned thereunder. Therefore, the respective TSVs inside the same column may have different voltages through the internal circuits of the semiconductor chips coupled in series, which makes it possible to increase a degree of freedom in design.

Figure 3:
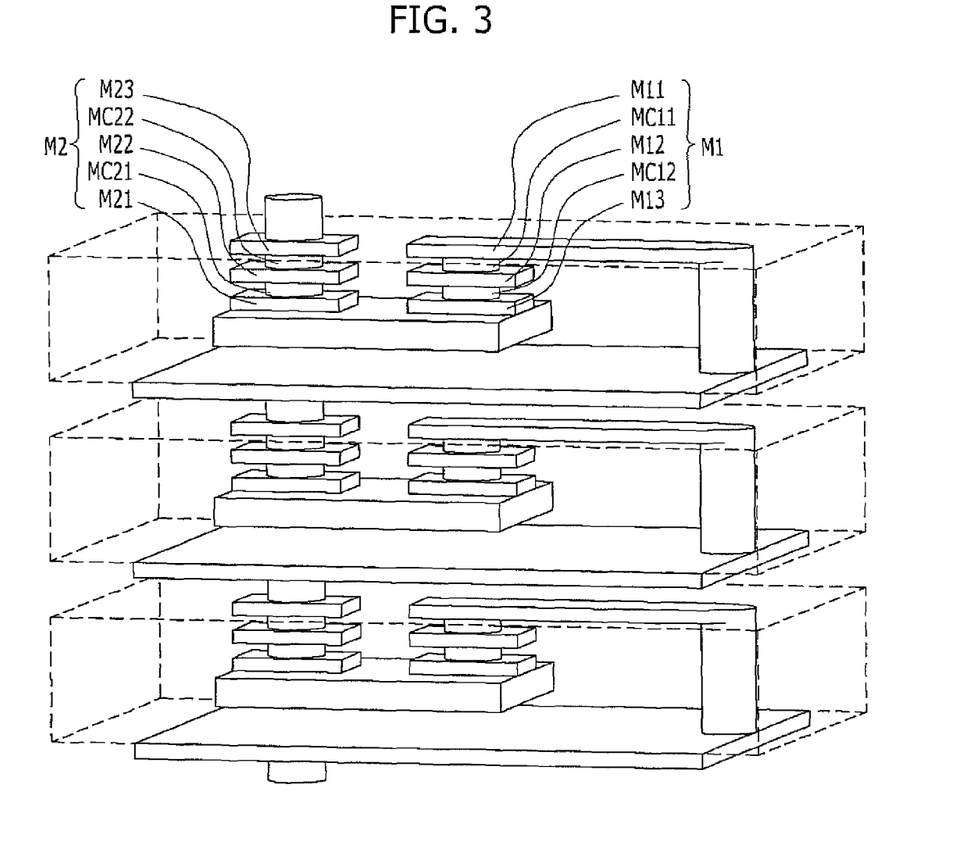
FIG. 3 is a three-dimensional diagram illustrating the semiconductor integrated circuit of FIG. 2 in more detail.

FIG. 3 is a three-dimensional diagram illustrating the semiconductor integrated circuit of FIG. 2 in more detail.

Referring to FIG. 3, each of the first and second metal paths M1 and M2 inside the semiconductor chip of the semiconductor integrated circuit having a multi-chip structure in accordance with the first embodiment of the present invention includes a plurality of metal lines and a plurality of metal contacts provided between the respective metal lines.

More specifically, the first metal path M1 includes first to third metal lines M11 to M13, and first and second metal contacts MC11 and MC12. The first metal line M11 is formed in a specific layer of the semiconductor layer and coupled to the serial through electrode. The second metal line M12 is formed below the first metal line M11. The third metal line M13 is formed below the second metal line M12 and in contact with the first internal circuit. The first metal contact MC11 couples the first metal line M11 to the second metal line M12. The second metal contact MC12 couples the second metal line M12 to the third metal line M13.

Furthermore, the second metal path M2 includes fourth to sixth metal lines M21 to M23, and third and fourth metal contacts MC21 and MC22. The fourth metal line M21 is in contact with the first internal circuit. The fifth metal line M22 is formed over the fourth metal line M21. The sixth metal line M23 is formed over the fifth metal line M22, or desirably in the uppermost layer in the semiconductor chip, and is in contact with the serial bump pad. The third metal contact MC21 couples the fourth metal line M21 to the fifth metal line M22. The fourth metal contact MC22 couples the fifth metal line M22 to the sixth metal line M23.

Specifically, the first and sixth metal lines M11 and M23 may be positioned in a first layer which is the uppermost layer of the semiconductor chip, the second and fifth metal lines M12 and M22 may be positioned in a second layer under the first layer, and the third and fourth metal lines M13 and M21 may be positioned in a third layer under the second layer.

The first and second metal paths M1 and M2 may be formed of Cu or Al or an alloy thereof.

The serial through electrode and the RDL may be formed of one of Sn, Ni, Cu, Au, and Al or an alloy thereof.

The RDL may be formed of an insulation material coated with Cu or Au.

Figure 4:
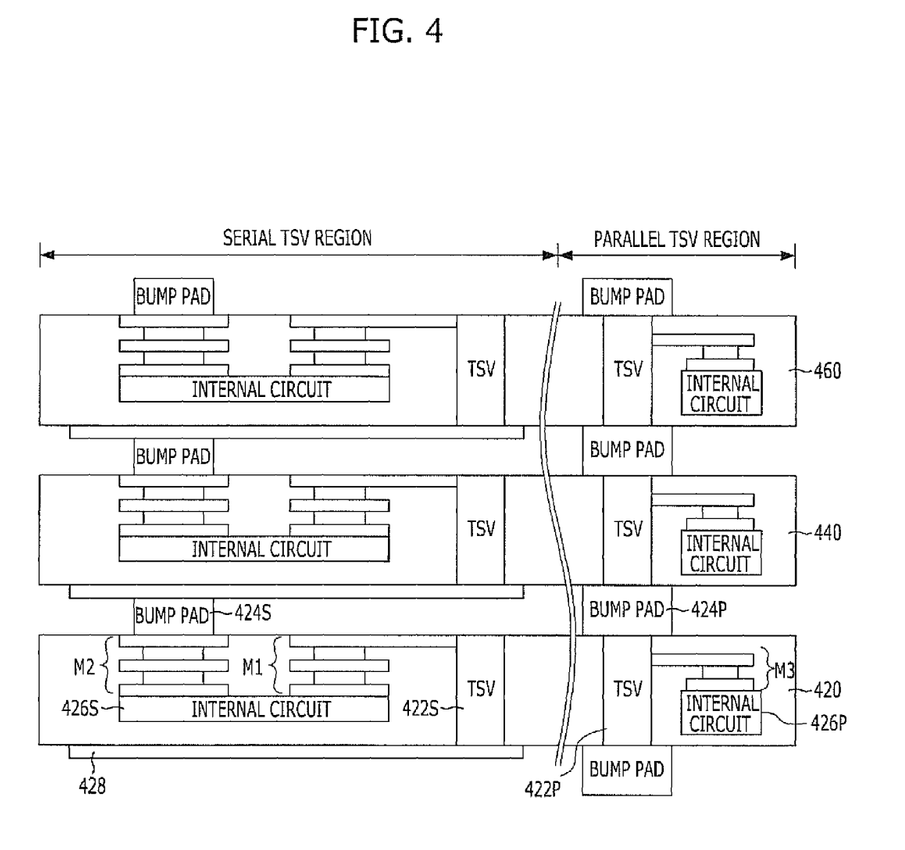
FIG. 4 is a cross-sectional view of a semiconductor integrated circuit having a multi-chip structure using TSVs in accordance with a second embodiment of the present invention.

FIG. 4 is a cross-sectional view of a semiconductor integrated circuit having a multi-chip structure using TSVs in accordance with a second embodiment of the present invention.

Referring to FIG. 4, the semiconductor integrated circuit 100 having a multi-chip structure in accordance with the second embodiment of the present invention includes a plurality of stacked semiconductor chips 420, 440, and 460. Each of the semiconductor chips 420, 440, and 460 in accordance with the second embodiment of the present invention includes a serial TSV region and a parallel TSV region. Therefore, internal circuits and through electrodes may be coupled in series as well as in parallel between the respective semiconductor chips.

Since the second and third semiconductor chips 440 and 460 may have the same configuration as the first semiconductor chip 420, the following descriptions will be focused on the first semiconductor chip 420.

The serial TSV region of the first semiconductor chip 420 includes a serial through electrode 422S, a serial bump pad 424S, a first internal circuit 426S, and an RDL 428.

The serial through electrode 422S is formed by burying a conductive material in a TSV formed through the serial TSV region of the first semiconductor chip 420.

The serial bump pad 424S is formed over the first semiconductor chip 420 to maintain a predetermined distance between the semiconductor chips. In particular, the serial bump pad 424S in accordance with the second embodiment of the present invention is formed over the top surface of the first semiconductor chip 420 at a region where the serial bump pad 424S is separated from the serial through electrode 422S.

The first internal circuit 426S is provided in the first semiconductor chip 420 and configured to receive an input signal, perform a designated operation, and output a signal. In particular, the first internal circuit 426S in accordance with the second embodiment of the present invention is coupled to the serial through electrode 422S through a first metal path M1, and coupled to the serial bump pad 424S through a second metal path M2.

The RDL 428 is formed over the backside of the first semiconductor chip 420 including the serial through electrode 422S, in order to form a redistribution path. In the second embodiment of the present invention, the RDLs formed over the backsides of the respective semiconductor chips and the serial bump pads formed over the top surfaces of the respective semiconductor chips may be used to couple the through electrodes and the internal circuits of the respective semiconductor chips in series. Then, although one vertical TSV column is used, a voltage signal which is controlled stage by stage while being passed through the respective chips may be generated. The serial through electrode 422S and the RDL 428 may be integrally formed.

In the serial TSV region of the first semiconductor chip 420 as described above, the first internal circuit 426S and the serial through electrode 422S of the first semiconductor chip 420 are coupled to the first internal circuits and the serial through electrodes of the semiconductor chips positioned under and over the first semiconductor chip 420, through the RDL 428 formed over the backside of the first semiconductor chip 420 and the serial bump pad 424S formed over the top surface of the first semiconductor chip 420, respectively.

The parallel TSV region of the first semiconductor chip 420 includes a parallel through electrode 422P, a parallel bump pad 424P, and a second internal circuit 426P.

The parallel through electrode 422P is formed by burying a conductive material in a TSV formed through the parallel TSV region of the first semiconductor chip 420.

The parallel bump pad 424P for maintaining a predetermined distance between the semiconductor chips is formed over the top surface of the first semiconductor chip 420 to be in contact with the parallel through electrode 422P.

The second internal circuit 426P is coupled to the parallel through electrode 422P through a third metal path M3 inside the first semiconductor chip 420. The second internal circuit 426P is configured to receive a signal inputted through the parallel through electrode 422P, perform a designated operation, and output a signal. The third metal path M3 includes a plurality of metal lines and a plurality of metal contacts provided between the respective metal lines.

In the parallel TSV region of the first semiconductor chip 420, the second internal circuit 426P and the parallel through electrode 422P of the first semiconductor chip 420 are coupled to the second internal circuit and the parallel through electrode of the second semiconductor chip 440 through the parallel bump pad 424P.

As a result, the semiconductor integrated circuit may have a multi-chip structure in which the parallel through electrode and the second internal circuit of one semiconductor chip are coupled in parallel to the parallel through electrode and the second internal circuit of another semiconductor chip positioned thereunder.

Although not illustrated, the semiconductor integrated circuit in accordance with the second embodiment of the present invention may further include a substrate to which the stacked semiconductor chips are attached. FIG. 4 illustrates the semiconductor integrated circuit including three semiconductor chips. However, the semiconductor integrated circuit may include a larger or smaller number of semiconductor chips.

As described above, the semiconductor integrated circuit in accordance with the second embodiment of the present invention may support both the serial coupling and the parallel coupling of the internal circuits and the through electrodes between the respective semiconductor chips. Therefore, the semiconductor integrated circuit may be designed in various structures.

FIGS. 5A to 5E are cross-sectional views explaining a method for fabricating the semiconductor integrated circuit having a multi-chip structure using TSVs in accordance with the second embodiment of the present invention.

Figure 5A:
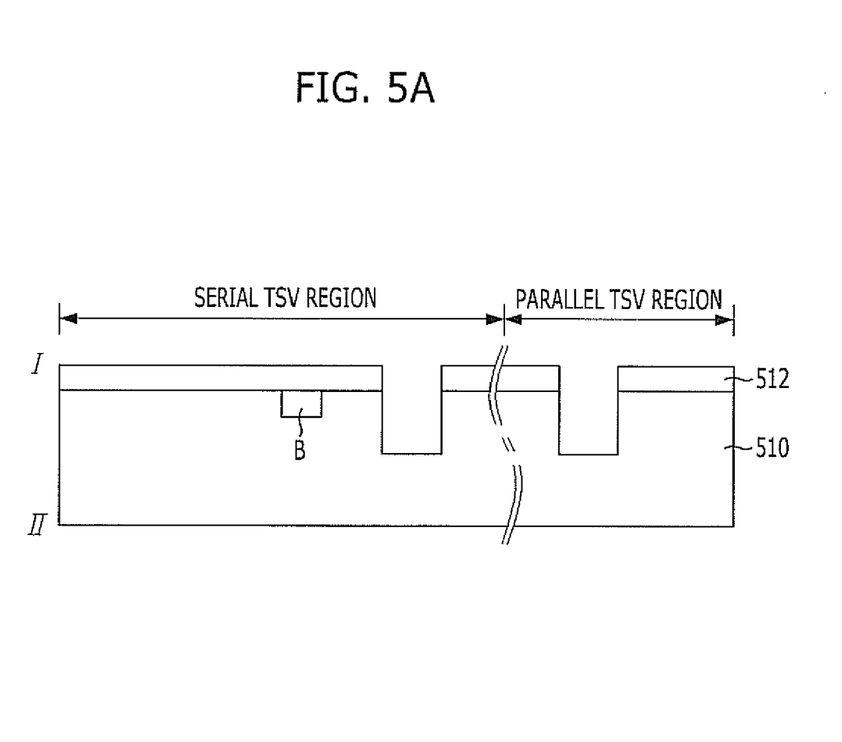
FIGS. 5A to 5E are cross-sectional views illustrating a method for fabricating the semiconductor integrated circuit having a multi-chip structure using TSVs in accordance with the second embodiment of the present invention.

Referring to FIG. 5A, a mask pattern 512 is formed over a semiconductor chip 510, and a plurality of trenches are formed to a predetermined depth in the semiconductor chip 510 such that the trenches do not penetrate through the semiconductor chip 510. The semiconductor chip 510 includes a serial TSV region and a parallel TSV region. The serial TSV region includes first and second metal paths and a first internal circuit coupled between the first and second metal paths. The first and second metal paths and the first internal circuit are not illustrated in FIG. 5A. The parallel TSV region includes a second internal circuit coupled to a third metal path. The second internal circuit and the third metal path are not illustrated in FIG. 5A.

Figure 5B:
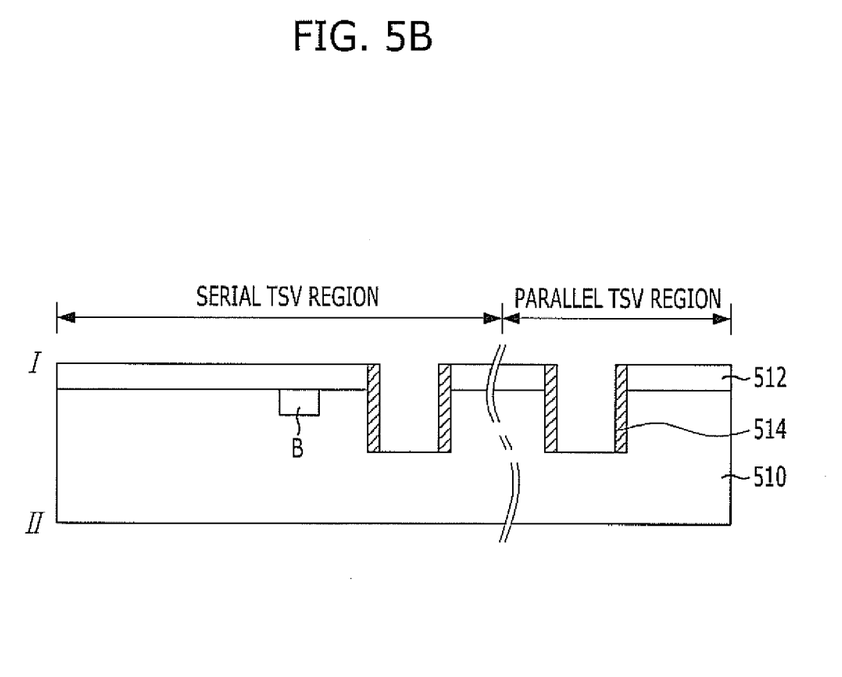

Referring to FIG. 5B, an insulation layer is formed over the top surface of the semiconductor chip 510 including the surfaces of the trenches, and an etch back process is performed so that the insulation layer 514 remains only on the sidewalls of the trenches. The mask pattern 512 is then removed.

Figure 5C:
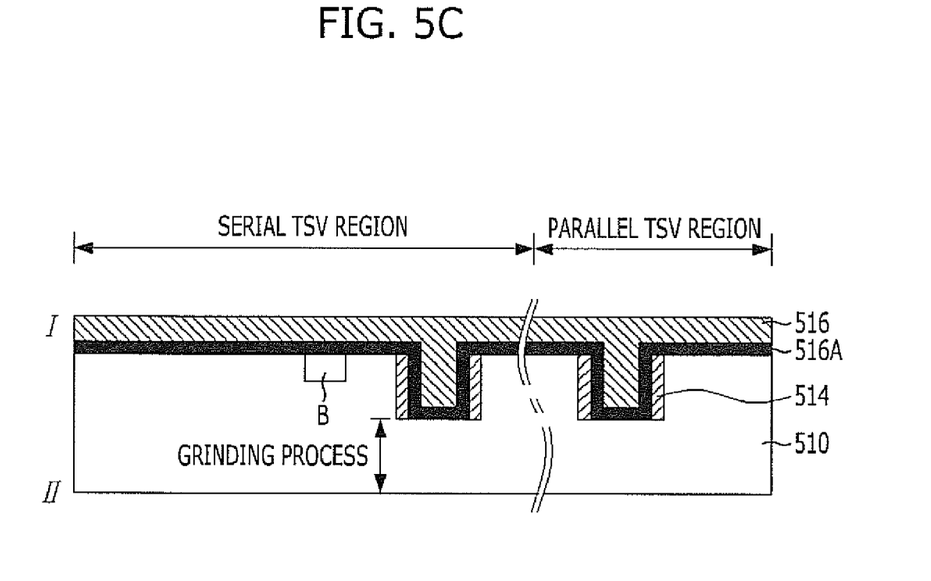

Referring to FIG. 5C, a metal seed layer 516A is formed over the semiconductor chip 510 including the insulation layer 514 formed over the sidewalls of the trenches. A plating process is performed on the metal seed layer 516A to form a metal layer 516 to fill the trenches. The metal layer 516 may be formed of one of Sn, Ni, Cu, Au, and Al or an alloy composed of one or more of the metals.

An etch back process is performed on the metal layer 516 to reduce the height of the metal layer 516 to a thickness required for forming a stack package.

Figure 5D:
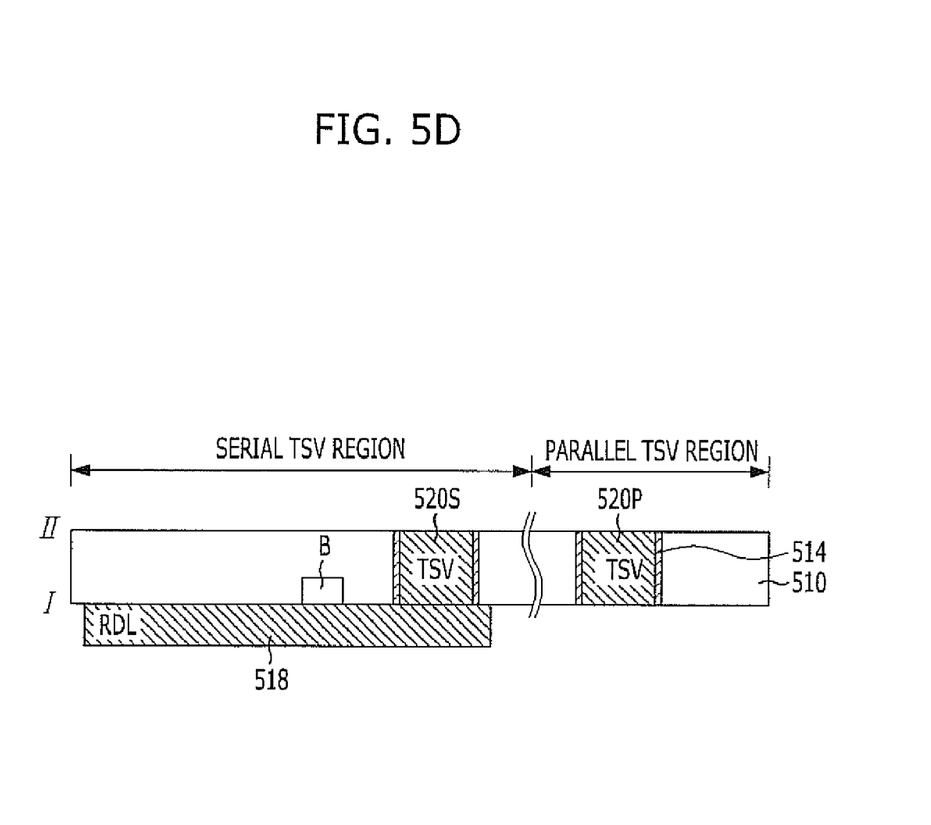

As shown in FIG. 5D, in the serial TSV region of the semiconductor chip 510, a patterning process is performed to partially remove the metal layer and the metal seed layer, and a serial through electrode 520S is formed to cover the upper part of the trench. An RDL 518 coupling a bonding pad to the serial through electrode 520S is formed.

Furthermore, in the parallel TSV region of the semiconductor chip 510, a patterning process is performed to remove the metal layer over the trench and the metal seed layer under the metal layer, and a parallel through electrode 520P is formed by filling the trench.

A grinding process and/or an etching process is performed to etch a backside of the semiconductor chip 510 to expose the serial through electrode 520S and the parallel through electrode 520P.

Referring to FIG. 5D, when the resultant structure is seen upside down from a I-II direction to a II-I direction, it is clear that the RDL 518 formed over the backside of the semiconductor chip is integrated with the serial through electrode 520S.

Figure 5E:
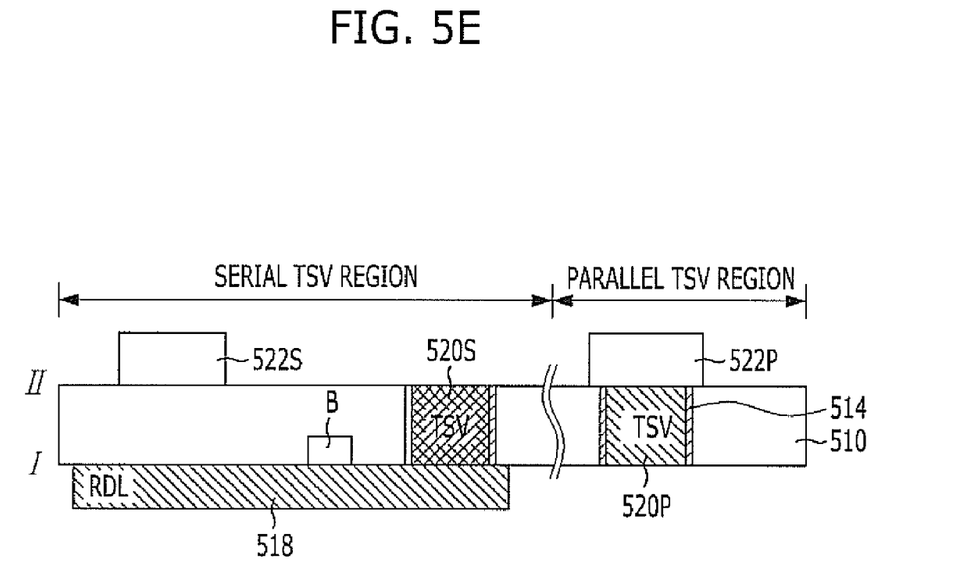

Referring to FIG. 5E, in the serial TSV region of the semiconductor chip 510, a serial bump pad 522S is formed over the semiconductor chip 510 at a region where the serial bump pad 522S is separated from the serial through electrode 520S. The first internal circuit inside the serial TSV region of the semiconductor chip 510 is coupled to the serial through electrode 520S through the first metal path, and is coupled to the serial bump pad 522S through the second metal path.

Furthermore, in the parallel TSV region of the semiconductor chip 510, the parallel bump pad 522P is formed over the semiconductor chip 510 to be in contact with the parallel through electrode 520P. The second internal circuit inside the parallel TSV region of the semiconductor chip 510 is coupled to the parallel through electrode 520P through the third metal path.

In the semiconductor integrated circuit having a multi-chip structure in accordance with the embodiments of the present invention, the through electrodes and the internal circuits of the respective semiconductor chips may be coupled in series or in parallel. Therefore, a degree of freedom in design may be increased.

Furthermore, since different voltage signals may be applied between the semiconductor chips within a vertical column of the same through electrode, a separate patterning process and a separate mask are not needed. Therefore, a reduction in mass production efficiency and a cost increase of the stack package may be substantially prevented.

Furthermore, since the through electrodes of the respective semiconductor chips do not need to be aligned accurately, the entire process time may be minimized or reduced.

Furthermore, the semiconductor integrated circuit may support the serial coupling and the parallel coupling of the internal circuits and the through electrodes between the semiconductor chips. Therefore, the semiconductor integrated circuit may be designed in various structures.

While the present invention has been described with respect to specific embodiments, it will be apparent to those skilled in the art that various changes and modifications may be made without departing from the spirit and scope of the invention as defined by the following claims.

What is claimed is:

1. A semiconductor integrated circuit having a multi-chip structure including a plurality of stacked semiconductor chips, each of the semiconductor chips comprising:
    a first through electrode arranged through the semiconductor chip;
    a first bump pad arranged over the semiconductor chip at a region where the first bump pad is separated from the first through electrode;
    a first internal circuit arranged inside the semiconductor chip, coupled to the first through electrode through a first metal path, and coupled to the first bump pad through a second metal path; and
    a redistribution layer (RDL) arranged over a backside of the semiconductor chip.

2. The semiconductor integrated circuit of claim 1, wherein the first internal circuit and the first through electrode of one semiconductor chip are coupled in series to the first internal circuit and the first through electrode of another semiconductor chip disposed thereunder.

3. The semiconductor integrated circuit of claim 1, wherein each of the semiconductor chips further comprises:
    a second through electrode arranged through the semiconductor chip;
    a second bump pad arranged over the semiconductor chip to be in contact with the second through electrode; and
    a second internal circuit arranged in the semiconductor chip and coupled to the second through electrode through a third metal path.

4. The semiconductor integrated circuit of claim 3, wherein the second internal circuit and the second through electrode of one semiconductor chip are coupled in parallel to the second internal circuit and the second through electrode of another semiconductor chip positioned thereunder.

5. The semiconductor integrated circuit of claim 3, wherein the first through electrode, the second through electrode, and the RDL each comprise one of Sn, Ni, Cu, Au, and Al or an alloy thereof.

6. The semiconductor integrated circuit of claim 1, wherein each of the first and second metal paths comprises a plurality of metal lines and a plurality of metal contacts arranged between the respective metal lines.

7. The semiconductor integrated circuit of claim 1, wherein the first metal path comprises:
    a first metal line arranged in an uppermost layer of the semiconductor chip and coupled to the first through electrode;
    a second metal line arranged below the first metal line and in contact with the first internal circuit; and
    a first metal contact coupling the first and second metal lines.

8. The semiconductor integrated circuit of claim 7, wherein the second metal path comprises:
    a third metal line in contact with the first internal circuit;
    a fourth metal line arranged in the uppermost layer of the semiconductor chip and in contact with the first bump pad; and
    a second metal contact coupling the third and fourth metal lines.

9. The semiconductor integrated circuit of claim 1, wherein the RDL comprises an insulation material coated with either Cu or Au.

10. The semiconductor integrated circuit of claim 1, wherein the first through electrode and the RDL are integrally formed.

11. The semiconductor integrated circuit of claim 1, wherein at least two semiconductor chips are stacked.

12. A method for fabricating a semiconductor integrated circuit having a multi-chip structure, comprising:
    forming a first trench in a semiconductor chip which includes first and second metal paths and a first internal circuit coupled between the first and second metal paths, the first trench being coupled to the first metal path;
    forming a first through electrode by filling the first trench of the semiconductor chip, and forming a redistribution layer (RDL) over a backside of the semiconductor chip, the RDL coupling the first through electrode to a corresponding bond pad; and
    forming a first bump pad over the semiconductor chip at a region where the first bump pad is separated from the first through electrode, the first bump pad being coupled to the first internal circuit through the second metal path.

13. The method of claim 12, wherein the first internal circuit and the first through electrode of one semiconductor chip are formed to be coupled in series to the first internal circuit and the first trough electrode of another semiconductor chip positioned thereunder.

14. The method of claim 12, further comprising:
   forming a second trench in the semiconductor chip which includes a third metal path and a second internal circuit;
   forming a second through electrode by filling the second trench of the semiconductor chip; and
   forming a second bump pad over each of the semiconductor chips to be in contact with the second through electrode.

15. The method of claim 12, wherein forming the first through electrodes and the RDL comprises:
   forming an insulation layer on sidewalls of the first trench formed in the semiconductor chip;
   forming a metal seed layer over the semiconductor chip including the insulation layer;
   forming a metal layer over the metal seed layer to fill the first trench; and
   patterning the metal layer and the metal seed layer.

16. The method of claim 12, wherein each of the first and second metal paths is formed to comprise a plurality of metal lines and a plurality of metal contacts coupled between respective metal lines.

17. The method of claim 12, wherein the first through electrode and the RDL are formed of one of Sn, Ni, Cu, Au, and Al or an alloy composed of at least one of Sn, Ni, Cu, Au, and Al.

18. The method of claim 12, further comprising stacking at least two semiconductor chips.

19. The method of claim 18, further comprising forming a substrate and attaching the stacked semiconductor chips thereto.

20. A semiconductor integrated circuit having a multi-chip structure including a plurality of stacked semiconductor chips, each of the semiconductor chips comprising:
   a serial through electrode arranged through the semiconductor chip;
   a parallel through electrode arranged through the semiconductor chip;
   a serial bump pad arranged over the semiconductor chip at a region where the serial bump pad is separated from the serial through electrode;
   a parallel bump pad arranged over the semiconductor chip to contact the parallel through electrode;
   a first internal circuit arranged in the semiconductor chip and coupled to the serial through electrode and the serial bump pad through the first and second metal paths, respectively;
   a second internal circuit coupled to the parallel through electrode through a third metal path; and
   an RDL arranged over a backside of the semiconductor chip including the serial through electrode.

* * * * *